US010739821B1

(12) United States Patent
Lin

(10) Patent No.: US 10,739,821 B1
(45) Date of Patent: Aug. 11, 2020

(54) EXPANSION APPARATUS FOR HANDHELD ELECTRONIC DEVICE

(71) Applicant: ASUSTEK COMPUTER INC., Taipei (TW)

(72) Inventor: Po-Han Lin, Taipei (TW)

(73) Assignee: ASUSTEK COMPUTER INC., Taipei (TW)

( * ) Notice: Subject to any disclaimer, the term of this patent is extended or adjusted under 35 U.S.C. 154(b) by 0 days.

(21) Appl. No.: 16/430,071

(22) Filed: Jun. 3, 2019

(30) Foreign Application Priority Data

Apr. 9, 2019 (TW) .............................. 108204300 U

(51) Int. Cl.
| | |
|---|---|
| *G06F 1/16* | (2006.01) |
| *H05K 5/00* | (2006.01) |
| *H05K 5/02* | (2006.01) |
| *H04M 1/04* | (2006.01) |
| *H05K 7/20* | (2006.01) |
| *H01R 33/945* | (2006.01) |
| *H01R 35/04* | (2006.01) |

(52) U.S. Cl.
CPC .......... *G06F 1/1632* (2013.01); *G06F 1/1647* (2013.01); *G06F 1/1654* (2013.01); *H04M 1/04* (2013.01); *H05K 5/0086* (2013.01); *H05K 5/023* (2013.01); *G06F 1/1643* (2013.01); *H01R 33/945* (2013.01); *H01R 35/04* (2013.01); *H05K 5/0226* (2013.01); *H05K 7/20963* (2013.01)

(58) Field of Classification Search
CPC .................................................. G06F 1/1632
See application file for complete search history.

(56) References Cited

U.S. PATENT DOCUMENTS

| | | | | |
|---|---|---|---|---|
| 5,537,343 | A * | 7/1996 | Kikinis ................. | G06F 1/1626 361/679.56 |
| 5,583,742 | A * | 12/1996 | Noda .................... | G06F 1/1626 248/632 |
| 6,038,128 | A * | 3/2000 | Hood, III .............. | G06F 1/1632 174/15.2 |

(Continued)

FOREIGN PATENT DOCUMENTS

| | | |
|---|---|---|
| CN | 202918345 U | 5/2013 |
| CN | 204392357 U | 6/2015 |
| CN | 205212884 U | 5/2016 |

OTHER PUBLICATIONS

Lin, Po-Han, "ASUS's first e-sports mobile phone ASUS ROG Phone release: super game performance, a variety of accessories", Jun. 4, 2018, 50 pages, https://www.eprice.com.tw/mobile/talk/4543/5089530/1/rv/asus-rog-phone-zs600kl-8gb 512gb-launch/.

*Primary Examiner* — Adrian S Wilson
(74) *Attorney, Agent, or Firm* — Muncy, Geissler, Olds & Lowe, P.C.

(57) ABSTRACT

An expansion apparatus applied to a handheld electronic device is disclosed. The expansion apparatus includes a first part and a second part. The first part includes a fixing base and a connector. The fixing base includes an accommodation space to accommodate the handheld electronic device. The connector is disposed on a side surface of the accommodation space for electrically connecting the handheld electronic device. The second part is pivotally connected to the first part to cover the accommodation space. The second part includes a screen and a vibration device. The screen faces the fixing base. The screen and the vibration device are electrically connected to the connector.

7 Claims, 5 Drawing Sheets

(56) References Cited

U.S. PATENT DOCUMENTS

| | | | | |
|---|---|---|---|---|
| 6,179,122 B1* | 1/2001 | Moncrief | ............... | G06F 1/1628 206/320 |
| 6,837,058 B1* | 1/2005 | McEuen | ............... | G06F 1/1626 361/679.41 |
| 7,106,580 B2* | 9/2006 | Kugimiya | ............... | G06F 1/1616 248/176.1 |
| 7,375,967 B2* | 5/2008 | Huang | ............... | G06F 1/1632 165/104.33 |
| D598,919 S * | 8/2009 | Takemasa | ............... | D14/432 |
| 8,467,178 B2* | 6/2013 | Probst | ............... | G06F 1/1616 345/168 |
| 8,573,394 B2* | 11/2013 | Ahee | ............... | G06F 1/1626 206/320 |
| 8,611,086 B1* | 12/2013 | Magnusson | ............... | G06F 1/1656 361/679.59 |
| 8,926,414 B1* | 1/2015 | Kirkpatrick | ............... | H05K 7/20136 361/679.41 |
| 8,929,070 B2* | 1/2015 | Liu | ............... | H05K 7/20145 165/104.33 |
| 2003/0137584 A1* | 7/2003 | Norvell | ............... | B60R 11/0235 348/61 |
| 2003/0222848 A1* | 12/2003 | Solomon | ............... | G06F 1/1601 345/156 |
| 2003/0235029 A1* | 12/2003 | Doherty | ............... | G06F 1/1632 361/679.27 |
| 2004/0230725 A1* | 11/2004 | Chen | ............... | G06F 1/1632 710/72 |
| 2006/0067036 A1* | 3/2006 | Lin | ............... | G06F 1/162 361/679.06 |
| 2010/0172081 A1* | 7/2010 | Tian | ............... | G06F 1/1626 361/679.29 |
| 2011/0222238 A1* | 9/2011 | Staats | ............... | G06F 1/1632 361/679.55 |
| 2014/0168884 A1* | 6/2014 | Wylie | ............... | G06F 1/1654 361/679.43 |
| 2017/0147087 A1* | 5/2017 | Pance | ............... | G06F 1/1616 |

* cited by examiner

EXPANSION APPARATUS FOR HANDHELD ELECTRONIC DEVICE

CROSS-REFERENCE TO RELATED APPLICATION

This application claims the priority benefit of Taiwan application serial No. 108204300, filed on Apr. 9, 2019. The entirety of the above-mentioned patent application is hereby incorporated by reference herein and made a part of the specification.

BACKGROUND OF THE INVENTION

Field of the Invention

The disclosure relates to a casing for an electronic device, and in particular, to an expansion apparatus for a handheld electronic device.

Description of the Related Art

With the development of technologies, handheld electronic devices such as smartphones have been widely applied to people's daily life. However, the functions are limited by the screen size and operation interface of the handheld electronic device. During the execution of some applications (for example, word processing applications, multimedia applications, and gaming applications), the operation and experience for users are apparently unsatisfactory.

BRIEF SUMMARY OF THE INVENTION

The disclosure provides an expansion apparatus, applied to a handheld electronic device. The expansion apparatus includes a first part and a second part. The first part includes a fixing base and a connector. The fixing base includes an accommodation space to accommodate the handheld electronic device. The connector is disposed on a side surface of the accommodation space for electrically connecting the handheld electronic device. The second part is pivotally connected to the first part to cover the accommodation space. The second part includes a screen and a vibration device. The screen faces the fixing base. The screen and the vibration device are electrically connected to the connector.

The expansion apparatus provided in the disclosure accommodates the handheld electronic device, and includes a screen and a vibration device. When the handheld electronic device is mounted inside the expansion apparatus, the screen provides more diverse displayed content and operation manners, and the vibration device provides a user with more diverse feedbacks, to improve operation experience of the user.

Specific embodiments of the disclosure will be further described by using the following embodiments and drawings.

DETAILED DESCRIPTION OF THE EMBODIMENTS

Specific embodiments of the disclosure will be described in further detail below with reference to schematic drawings. The advantages and features of the disclosure will become more apparent from the following description and claims. It should be noted that the drawings are all in a very simplified form and are not drawn to accurate scale, but are merely used for convenient and clear description of the embodiments of the disclosure.

Figure 1A:
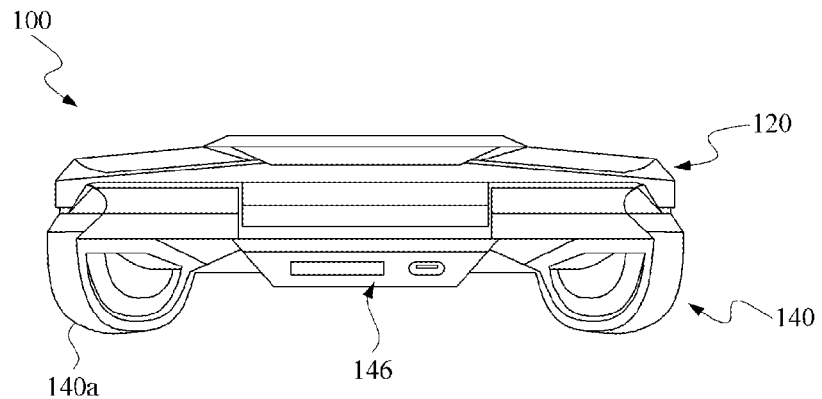
FIG. 1A to FIG. 1C are respectively a front view, a rear view, and a top view of an embodiment of an expansion apparatus according to the disclosure.
Figure 1B:
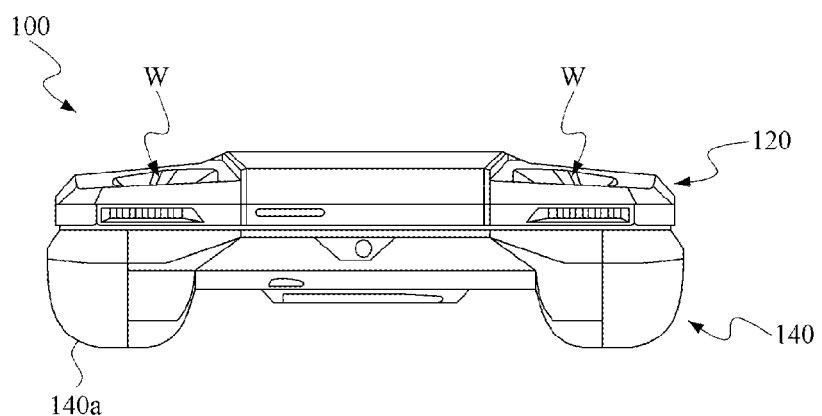
Figure 1C:
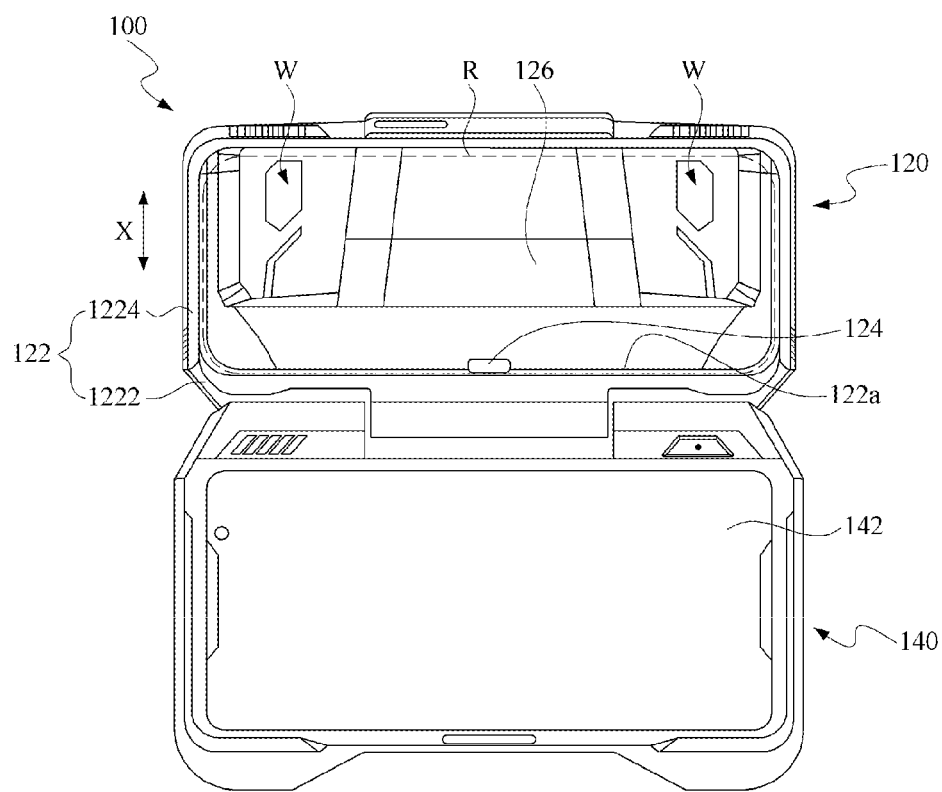
Figure 2:
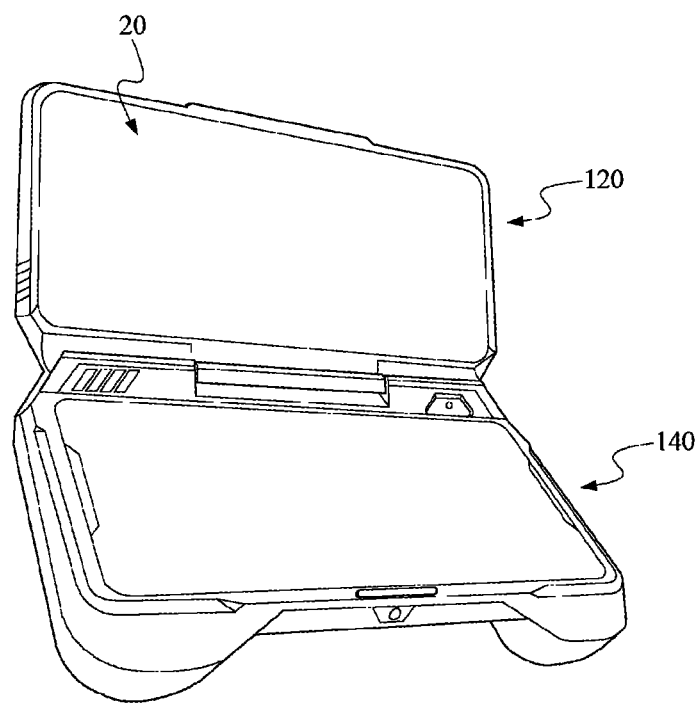
FIG. 2 is a schematic diagram showing that a handheld electronic device is mounted inside an expansion apparatus for an operation.
Figure 3:
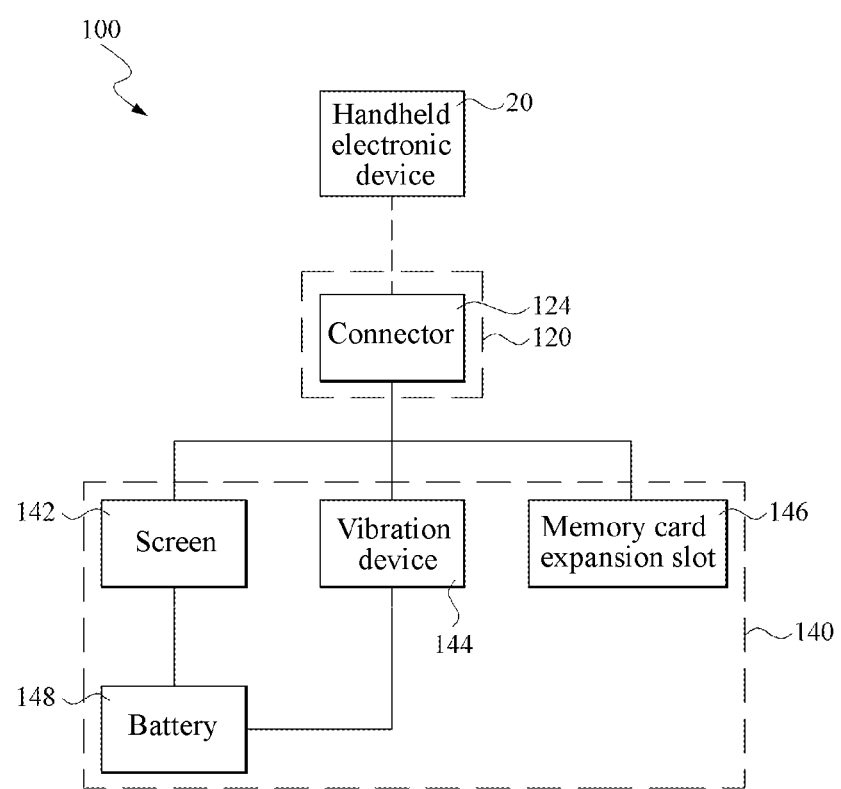
FIG. 3 is a schematic block diagram of an embodiment of the expansion apparatus in FIG. 1.

FIG. 1A to FIG. 1C are respectively a front view, a rear view, and a top view of an embodiment of an expansion apparatus according to the disclosure. FIG. 1A and FIG. 1B are respectively the front view and the rear view of the expansion apparatus in a closed state, and FIG. 1C is the top view of the expansion apparatus in an open state. FIG. 2 is a schematic diagram showing that a handheld electronic device is mounted inside an expansion apparatus for an operation. FIG. 3 is a schematic block diagram of an embodiment of the expansion apparatus in FIG. 1. In an embodiment, the handheld electronic device is a handheld communications device such as a smartphone.

As shown in FIG. 1A to FIG. 1C, the expansion apparatus 100 includes a first part 120 and a second part 140. The second part 140 is pivotally connected to the first part 140.

The first part 120 includes a fixing base 122 and a connector 124. The fixing base 122 includes an accommodation space R to accommodate the handheld electronic device 20. The connector 124 is disposed on a side surface 122*a* of the accommodation space R for electrically connecting the handheld electronic device 20. In this embodiment, the accommodation space R is a rectangular space to fit the shape of the handheld electronic device 20.

The connector 124 is disposed on the side surface of the accommodation space R. For example, the connector 124 is disposed on the side surface of a related longer side of the accommodation space R, and this is not limited herein. To adapt to different arrangement positions of a jack of the handheld electronic device 20, the connector 124 is alternatively disposed on a side surface of a related shorter side of the accommodation space R or on a bottom surface of the accommodation space R.

The fixing base 122 includes a base 1222 and a fixing structure 1224. The fixing structure 1224 is movably connected to the base 1222. A moving direction X of the fixing structure 1224 is shown in FIG. 1C. The accommodation space R is defined between the base 1222 and the fixing structure 1224. When a user places the handheld electronic device 20 in the accommodation space R, the user first pulls the fixing structure 1224 outwards to place the handheld electronic device 20, and then pushes the fixing structure 1224 inwards to fix the handheld electronic device 20.

Next, as shown in the figure, the first part 120 further includes a heat dissipation element 126. The heat dissipation element 126 is disposed at a bottom of the accommodation space R, to increase the heat dissipation efficiency of the handheld electronic device 20 when the handheld electronic device 20 is placed in the accommodation space R. The heat dissipation element 126 is a heat sink or a heat dissipation fan. In the figure, a heat sink is used as an example.

In addition, the fixing base 122 of the first part 120 further includes at least one opening W (where an example in which two openings exist is used in the figure) formed at the bottom of the accommodation space R. The positions of the openings W correspond to the positions of rear-facing the camera of the handheld electronic device 20. In this way, even if the handheld electronic device 20 is disposed in the accommodation space R, the user still performs a photographing function of the handheld electronic device 20 through the openings W without removing handheld electronic device 20.

The second part 140 is pivotally connected to the first part 120 to provide two use states, namely, a closed state and an open state. In the closed state, the second part 140 covers the first part 120 to accommodate the handheld electronic device 20. For the open state, refer to FIG. 2. In this embodiment, the second part 140 is a holding part of the expansion apparatus 100. Left and right sides of a bottom of the second part 140 are provided with holding structures 140*a* to facilitate holding by the user.

The second part 140 includes a screen 142, a vibration device 144, an expansion slot of memory card 146, and a battery 148. The screen 142 is disposed on a side (that is, an upper side of the second part 140 in the figure), facing the fixing base 122 of the first part 120, of the second part 140. The vibration device 144 is disposed on a side (that is, a lower side of the second part 140 in the figure), away from the fixing base 122 of the first part, of the second part 140.

The screen 142 and the vibration device 144 are electrically connected to the connector 124 located in the accommodation space R of the first part 120. In this way, when the user places the handheld electronic device 20 in the accommodation space R, the screen 142 and the vibration device 144 located at the second part 140 are electrically connected to the handheld electronic device 20 by using the connector 124 located in the accommodation space R.

In an embodiment, the screen 142 is a touchscreen in which touch and input functions are integrated. In this way, the user performs an operation on the handheld electronic device 20 by using the screen 142. In an embodiment, the vibration device 144 is disposed inside the holding structure 140*a* at the bottom of the second part 140, to provide the user with an obvious vibration feedback.

The expansion slot of memory card 146 is disposed on the side (that is, the lower side of the second part 140 in the figure), away from the fixing base 122 of the first part 120, of the second part 140. In an embodiment, the expansion slot of memory card 146 is disposed at a central position of the bottom of the second part 140, that is, disposed at a concave position between the two holding structures 140*a*. The expansion slot of memory card 146 is also electrically connected to the connector 124. In this way, when the user places the handheld electronic device 20 in the accommodation space R, the handheld electronic device 20 is electrically connected to the expansion slot of memory card 146 by using the connector 124 to obtain additional memory space.

The battery 148 is disposed in the second part 140 to supply power to the screen 142 and the vibration device 144. In an embodiment, the battery 148 further charges the handheld electronic device 20 by using the connector 124. In an embodiment, the battery 148 is disposed inside the holding structure 140*a* at the bottom of the second part 140, to provide appropriate weight distribution to facilitate a holding operation by the user.

As shown in FIG. 1C, in the foregoing embodiment, only one connector 124 is disposed in the accommodation space R of the first part 120 for connecting the handheld electronic device. However, this is not limited herein. In the invention, a plurality of connectors 124 is alternatively disposed at different positions in the accommodation space R to adapt to different types of handheld electronic devices.

Figure 4:
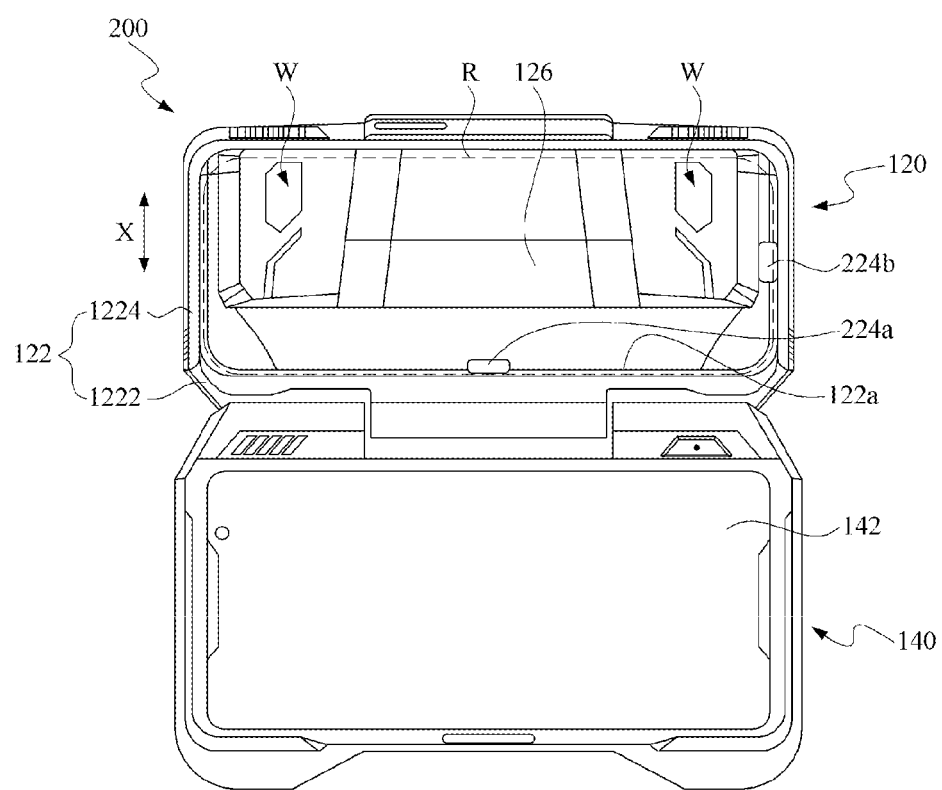
FIG. 4 is a top view of another embodiment of an expansion apparatus according to the disclosure.

FIG. 4 is a top view of another embodiment of an expansion apparatus according to the disclosure. As shown in the figure, the expansion apparatus 200 includes two connectors 224*a* and 224*b*. The connectors 224*a* and 224*b* are respectively disposed on a side surface of a related longer side of an accommodation space R and a side surface of a shorter side of the accommodation space R to fit different types of handheld electronic devices.

In the foregoing embodiment, a fixing base 122 includes a base 1222 and a fixing structure 1224 to fix the handheld electronic device. However, this is not limited herein. In an embodiment, the fixing base 122 is alternatively a single-structure element and fixes the handheld electronic device in a clamping manner.

In the foregoing embodiment, the fixing base 122 for placing the handheld electronic device and holding structures 140*a* for holding by the user are located at different parts of the expansion apparatus 100, to be specific, are located at a first part 120 and a second part 140. However, this is not limited herein. In an embodiment, the holding structures 140*a* are alternatively formed on outer sides of the first part 120 for holding by the user.

The expansion apparatus provided in the disclosure includes a screen and a vibration device. When the handheld electronic device is mounted inside the expansion apparatus, the screen provides more diverse displayed content and operation manners, and the vibration device provides the user with more diverse feedbacks, to improve operation experience of the user.

The foregoing descriptions are merely preferred embodiments of the disclosure and are not intended to limit the disclosure in any way. Any person skilled in the art can make any form of equivalent replacement or modification to the technical means and technical content disclosed by the disclosure without departing from the scope of the technical means of the disclosure, and such equivalent replacement or modification does not depart from the content of the technical means of the disclosure and still falls within the protection scope of the disclosure.

What is claimed is:

1. An expansion apparatus, applied to a handheld electronic device, the expansion apparatus comprising:
   a first part, comprising a fixing base and a connector, wherein the fixing base has an accommodation space to accommodate the handheld electronic device, and the connector is disposed on a side surface of the accommodation space for electrically connecting the handheld electronic device; and
   a second part, pivotally connected to the first part, having a bottom thereof provided with two holding structures for facilitating holding by a user, and comprising a screen, a vibration device and a battery, the vibration device being disposed inside one of the two holding structures to provide the user with an obvious vibration feedback, the screen facing the fixing base, the screen and the vibration device being electrically connected to the connector, the battery disposed inside another one of the two holding structures at the bottom of the second part for providing weight distribution to facilitate the holding by the user and for supplying power to the screen, the vibration device and the handheld electronic device.

2. The expansion apparatus according to claim 1, wherein the first part further comprises a heat dissipation element disposed at a bottom of the accommodation space.

3. The expansion apparatus according to claim 1, wherein the connector is disposed on a side of the accommodation space.

4. The expansion apparatus according to claim 1, wherein the fixing base comprises a base and a fixing structure, the accommodation space is defined between the base and the fixing structure, and the fixing structure is movably connected to the base.

5. The expansion apparatus according to claim 1, wherein the first part comprises at least one opening located at a bottom of the accommodation space, and the position of the at least one opening corresponds to the position of a camera of the handheld electronic device.

6. The expansion apparatus according to claim 1, wherein the second part further comprises an expansion slot of memory card electrically connected to the connector.

7. The expansion apparatus according to claim 6, wherein the screen is disposed on an upper surface of the second part, and the expansion slot of memory card is formed on a lower surface of the second part.

\* \* \* \* \*